US007235463B2

(12) United States Patent
Huang

(10) Patent No.: US 7,235,463 B2
(45) Date of Patent: Jun. 26, 2007

(54) METHOD FOR FABRICATING AN ELECTRICAL INSULATOR

(75) Inventor: Yan-Ming Huang, Fongyuan (TW)

(73) Assignee: Wintek Corporation, Taichung (TW)

( * ) Notice: Subject to any disclaimer, the term of this patent is extended or adjusted under 35 U.S.C. 154(b) by 208 days.

(21) Appl. No.: 10/998,717

(22) Filed: Nov. 30, 2004

(65) Prior Publication Data

US 2006/0115995 A1 Jun. 1, 2006

(51) Int. Cl.
*H01L 21/033* (2006.01)
*H01L 21/027* (2006.01)

(52) U.S. Cl. ...................................... 438/461; 438/460

(58) Field of Classification Search ................ 438/680, 438/671

See application file for complete search history.

(56) References Cited

U.S. PATENT DOCUMENTS 5,701,055 A 12/1997 Miyaguchi et al.
5,962,970 A 10/1999 Miyaguchi et al.
6,099,746 A 8/2000 Kim
6,137,220 A 10/2000 Murayama et al.

*Primary Examiner*—Zandra V. Smith
*Assistant Examiner*—Pamela E Perkins
(74) *Attorney, Agent, or Firm*—Bacon & Thomas, PLLC

(57) ABSTRACT

An electrode insulator and method for fabricating the same, wherein a T-shape electrode insulator made of inorganic dielectric material is fabricated perpendicular to the first electrode formed on the substrate, and insulating the second electrode from the first electrode. Inorganic films are used twice to form the insulator, and the T-shaped insulator fabricated is composed of two parts, the lower part is a column of ridge and the upper part is a horizontal cover to form an overhanging portion. Thereby, the overhanging portion can prevent metal film of the second electrode from forming between two insulators, so that the insulation can be achieved.

5 Claims, 5 Drawing Sheets

50
34
33
21
32
10

21
10

METHOD FOR FABRICATING AN ELECTRICAL INSULATOR

FIELD OF THE INVENTION

An electrode insulator and method for fabricating the same, particularly relates to fabrication of the organic light-emitting diode (OLED) insulator using inorganic films. The insulator and its fabrication method can be applied to the fabrication of the OLED flat panel.

BACKGROUND OF THE INVENTION

Organic light emitting diodes (OLED) are self-luminous devices with many advantages, such as very thin thickness, quick response, wide view angle, optimal resolution, high luminance, usable in flexible panel, and wide operating temperatures. OLED has been regarded as the new generation of the flat panel display technology after the thin film transistor liquid crystal display (TFT-LCD). The operating principle of the OLED is based on the light-emitting characteristics of the organic layer. As the electron and hole meet to form excitons through the organic layer, the energy promotes the light-emitting molecules to the excited state, and the light-emitting devices with different wavelengths are generated as the excited electrons fall into the ground state. The anode is made of ITO conductive films by sputtering or evaporating adheres to the glass or transparent plastic substrate, and the cathode is made of Mg, Al or Li, etc. The light-emitting region between two electrodes consists of many organic layers, including the hole injection layer (HIL), hole transport layer (HTL), emitting layer and electron transport layer (ETL). In actual production, other layers may be included to meet different requirements.

Although OLED has many advantages, the most commonly used fabrication technology for the OLED electrode insulator disclosed in the United State Patent Nos. U.S. Pat. No. 5,701,055, U.S. Pat. No. 5,962,970, U.S. Pat. No. 6,099,746, and U.S. Pat. No. 6,137,220 suggest that the insulator is produced by organic photoresists and two-mask processes. Further, the patents disclosed that positive photoresist is used to form an insulation photoresist on the substrate, and negative photoresist is used to form an inverse-triangular overhanging portion for sliver-like barrier rib. However, the insulator composed of organic photoresist is weak in mechanical strength and is easily damaged by external forces during fabrication. Besides, the insulator made of organic photoresist may precipitate organic materials that can affect the performance of other organic layers in the flat panel. Simultaneously, the insulator is not easily miniaturized for the physical limitations of the organic photoresist.

SUMMARY OF THE INVENTION

Therefore, the purpose of present invention is to construct the insulator by using inorganic films, which can enhance the mechanical strength of the insulator. Thus, the previous drawbacks can be avoided.

Another objective of present invention is to avoid the precipitation of the organic material by using inorganic insulators. The precipitation may affect the performance of other organic layers in the flat panel.

A T-shape electrode insulator made of inorganic dielectric material is fabricated perpendicular to the first electrode formed on the substrate, and insulating the second electrode from the first electrode.

The fabrication method of the invention is to produce a T-shape electrode insulator fabricated perpendicular to the first electrode formed on the substrate, and insulating the second electrode from the first electrode. The fabrication processes are described as follow.

(a) a photoresist is spun on the substrate and patterned by lithography with the first mask, and the deposition-mask is then formed on the substrate.
(b) an inorganic dielectric thin film is deposited, from which columns of ridges of the insulator are formed.
(c) the deposition-mask is stripped by lift-off technique, thereby constructing columns of ridges.
(d) a photoresist is spun on the substrate, an inorganic film is deposited on the photoresist, and a second, top photoresist is spun on the inorganic film.
(e) the top photoresist is patterned and developed with the second mask to form the troughs, and the inorganic film beneath the troughs is etched, and then the photoresist under the inorganic film is etched through the troughs until the columns of ridges expose themselves to the air with some height.
(f) an inorganic film is deposited into the troughs to form the covers.
(g) both the first and second photoresist layers and the inorganic layer are stripped, and thereby the T-shaped insulators are constructed.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
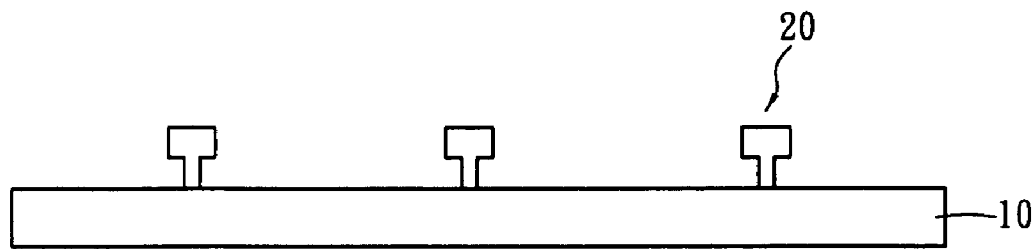
FIG. 1 is a cross-sectional view showing the electrode insulator of the present invention.

FIG. 1 shows an insulator (20) is fabricated perpendicular to the first electrode formed on the substrate (10), and insulating the second electrode from the first electrode. The key feature is that the insulator (20) is made of SiO2-based, Siloxane-based, SiN-based or ceramic-like inorganic dielectric materials and has a T-shaped structure.

Figure 2:
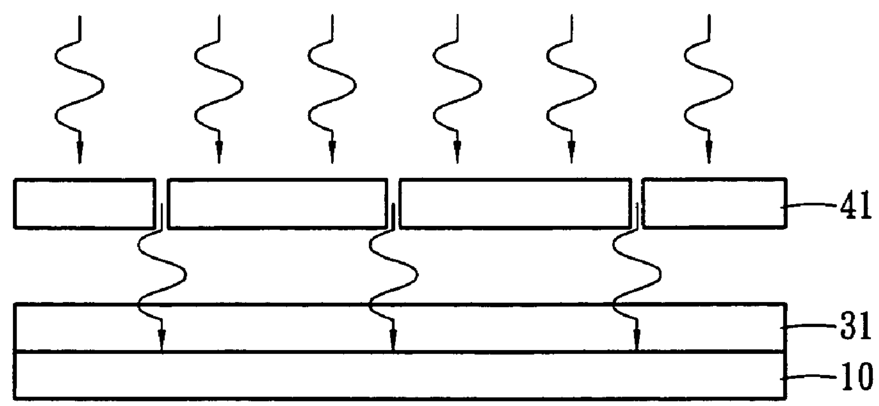
FIGS. 2 to 10 are cross-sectional views of the processes for fabricating the insulator.

FIGS. 2 to 10 show the fabrication processes of the insulator (20). The insulator (20) has a T-shaped structure and is perpendicular to the first electrode formed on the substrate (10), insulating the second electrode from the first electrode. The fabrication processes are:

(a) A photoresist (31) is spun on the substrate (10) and patterned by lithography with the first mask (41), as shown in FIG. 2, and the deposition mask (311) is then formed on the substrate (10).

Figures 3, 4:
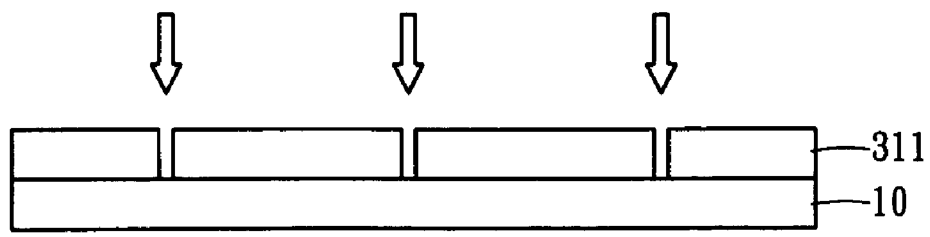

(b) An inorganic dielectric thin film is deposited on the substrate (10) through the deposition-mask (311) to form the ridge (21) of the insulator (20), as shown in FIG. 3. The inorganic dielectric thin film is deposited by Physical Vapor Deposition (PVD) or Chemical Vapor Deposition (CVD), and is selected from the SiO2-based, Siloxane-based, SiN-based, or ceramic-like materials.

(c) The deposition-mask (311) is stripped by lift-off technique, thereby constructing columns of inorganic ridges (21), as shown in FIG. 4.

Figure 5:
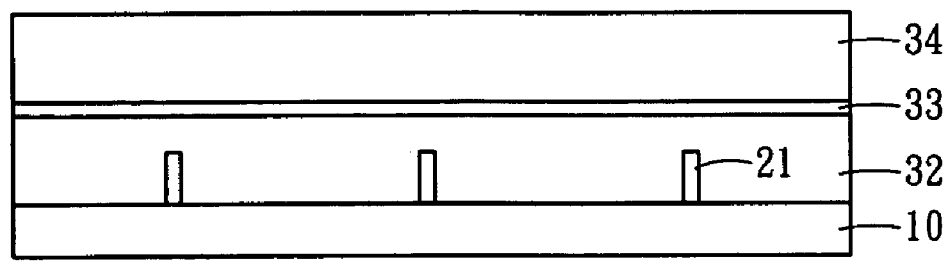

(d) A photoresist (32) is spun to cover the substrate (10) that has ridges (21) on it, an inorganic film (33) is deposited on the photoresist (32) as a buffer layer, and a second, top photoresist (34) is spun on the inorganic film, as shown in FIG. 5. The inorganic dielectric thin film is deposited by Physical Vapor Deposition (PVD) or Chemical Vapor Deposition (CVD), and is selected from the SiO2-based, Siloxane-based, SiN-based or ceramic-like materials.

Figure 6:
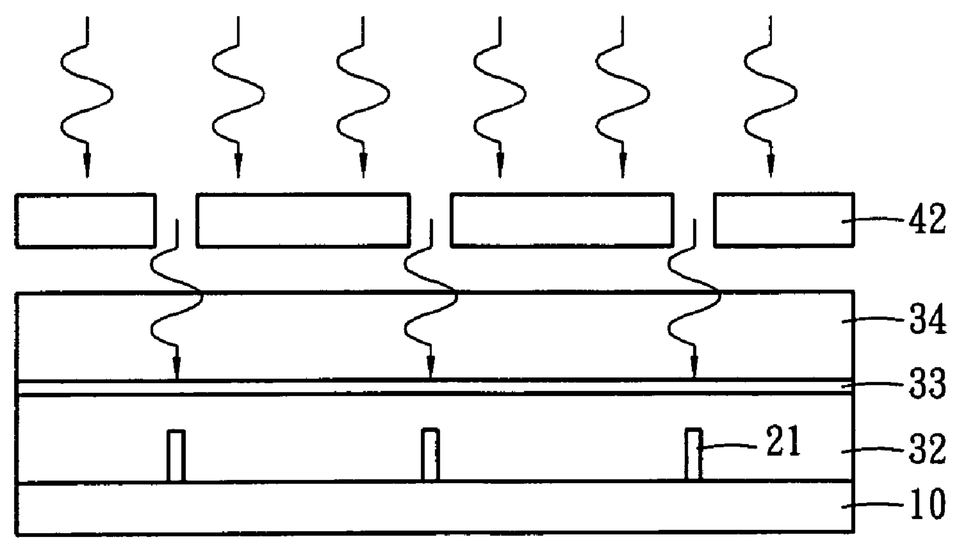

(e) The top photoresist (34) is patterned and developed by lithography with the second mask (42), as shown in FIG. 6, to form the trough (50) just above the ridge (21), and the width of the trough (50) is bigger than the ridge (21). The function of the dielectric inorganic thin film (33) is used to be an auto-stop developing, when the trough (50) is etched with the second mask (42).

Figure 7:
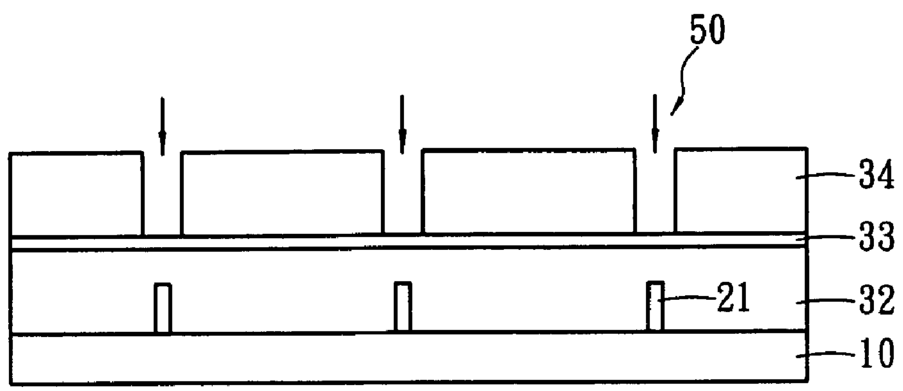
Figure 8:
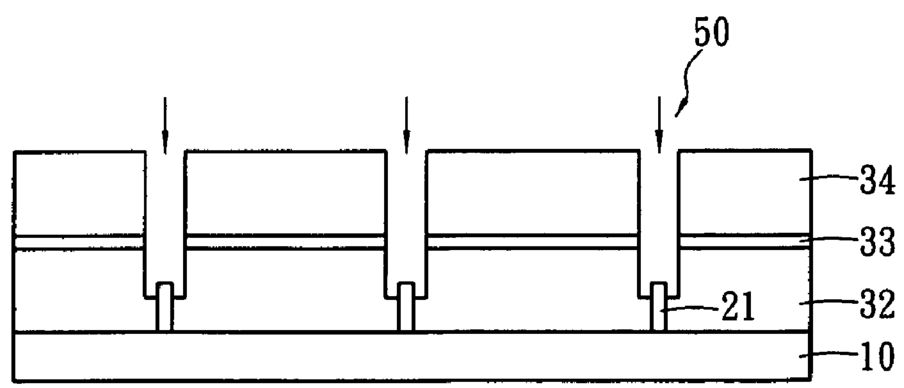
Figure 9:
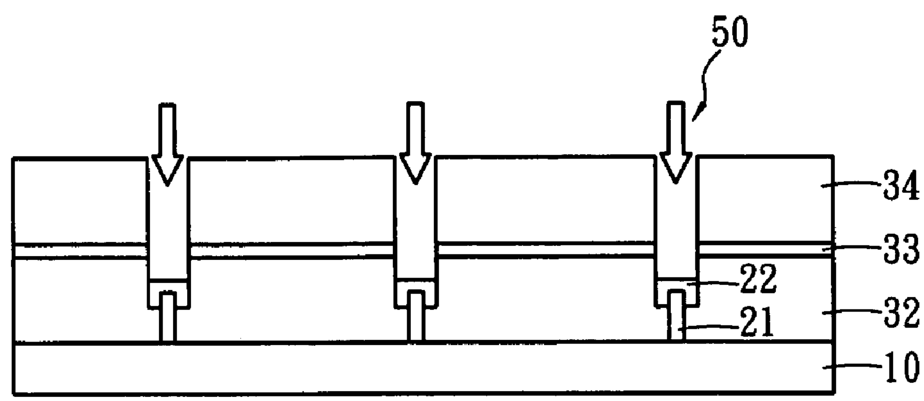
Figure 10:
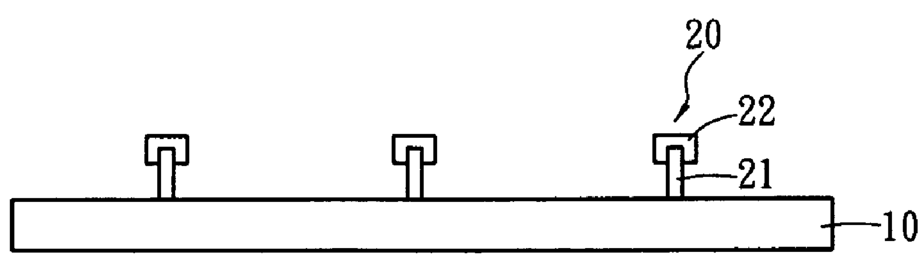

Thereafter, a wet etching or dry etching method is used to etch the inorganic film beneath the troughs, as shown in FIG. 7. Giving a dry etching as an example, the CF4 can be an etchant when the inorganic film (33) is SiO2. The etching reactions are $$CF_{4(g)} \rightarrow 2F_{(g)} + CF_{2(g)}$$

$$SiO_{2(g)} + 4F_{(g)} \rightarrow SiF_{4(g)} + 2O_{(g)}$$

$$SiO_{2(g)} + 2CF_{2(g)} \rightarrow SiF_{4(g)} + 2CO_{(g)}$$

The surface profiler can be used to determine whether etch is complete during the process. Of course, the selectivity problem for the etch-masking layer (32) must be considered when selecting the etchant.

After that, $O_3$ gas is used to etch the photoresist (32) under the inorganic film through the troughs (50) until the columns of ridges (21) expose themselves to the air with some height. The objective of the process is to expose the ridges (21) for forming the upper covers (22).

(f) Immediately, an inorganic insulation film is deposited into the troughs (50) to cover the outcrop of the ridges by PVD or CVD to form the covers (22). The inorganic dielectric thin film is selected from the SiO2-based, Siloxane-based, SiN-based or ceramic-like materials Attention should be paid to the adhesive force between the ridge (21) and the cover (22) and the shadow effect induced by the thickness of the cover (22).

(g) Finally, both the first and second photoresist layers (34, 32) and the inorganic layer (33) are stripped, and thereby the T-shaped insulator assembled by the ridge (21) and cover (22) is constructed.

Inorganic films are used twice to form the T-shaped insulator (20), and the T-shaped insulator (20) is composed of two parts, the lower part is a column of ridge (21) and the upper part is a horizontal cover (22) to form an overhanging portion. The overhanging portion can prevent the metal film of the second electrode being formed between two insulators (20), so that the insulation can be achieved.

As compare with other technologies, the merits in the present invention are:

1. Instead of the frangible, conventional, organic photoresist, the insulator is constructed by using inorganic films in this invention, which has stronger mechanical strength.
2. The Insulator made of inorganic films is stronger, and in addition, can avoid the precipitation of the organic material that may affect the performance of other organic materials in the flat panel and damages the display panel.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating electrode insulator perpendicular to a first electrode formed on a substrate, and insulating a second electrode from said first electrode, comprising the steps of: kk (a) spinning a photoresist on the substrate and patterning the photoresist by lithography with a first mask to form a deposition-mask on the substrate;

(b) depositing an inorganic dielectric thin film with insulation from which a column of ridges is constructed;

(c) stripping the deposition-mask by lift-off technique, thereby constructing a column of ridges from the inorganic dielectric thin film with insulation;

(d) spinning a photoresist on the substrate, depositing an inorganic film on the photoresist, and spinning a second, top photoresist on the inorganic film;

(e) patterning and developing the top photoresist with a second mask to form troughs, etching the inorganic film beneath the troughs, and etching the photoresist under the inorganic film through the troughs until the columns of ridges are exposed to the air with desired height;

(f) depositing an inorganic film into the trough to form the cover which covers the ridge; and (g) stripping both the first and second photoresist layers and the inorganic layer, thereby constructing the T-shaped insulator assembled by the ridge and the cover.

2. The method for fabricating electrode insulator of claim 1, wherein the deposition method is Physical Vapor Deposition (PVD) or Chemical Vapor Deposition (CVD).

3. The method for fabricating electrode insulator of claim 1, wherein the inorganic dielectric thin film is made of the SiO2-based, Siloxane-based, SiN-based or ceramic-like materials.

4. The method for fabricating electrode insulator of claim 1, wherein the trough is located above the ridge.

5. The method for fabricating electrode insulator of claim 1, wherein the trough is wider than the ridge.

* * * * *